United States Patent
Mitsuyoshi (10) Patent No.: US 7,134,826 B2
(45) Date of Patent: Nov. 14, 2006

(54) SUBSTRATE TRANSFER APPARATUS, SUBSTRATE PROCESSING APPARATUS AND HOLDING TABLE

(75) Inventor: Ichiro Mitsuyoshi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 137 days.

(21) Appl. No.: 10/299,638

(22) Filed: Nov. 19, 2002

(65) Prior Publication Data

US 2003/0099527 A1 May 29, 2003

(30) Foreign Application Priority Data

Nov. 28, 2001 (JP) ............................ P2001-362064

(51) Int. Cl.
*B65G 49/07* (2006.01)
(52) U.S. Cl. ..................... 414/222.01; 414/217.1; 414/940
(58) Field of Classification Search ............... 414/217, 414/217.1, 940, 222.01, 222.13
See application file for complete search history.

(56) References Cited

U.S. PATENT DOCUMENTS

| | | | | |
|---|---|---|---|---|
| 5,464,313 A | * | 11/1995 | Ohsawa | 414/172 |
| 5,570,990 A | * | 11/1996 | Bonora et al. | 414/543 |
| 5,980,183 A | * | 11/1999 | Fosnight | 414/222.01 |
| 6,379,096 B1 | * | 4/2002 | Beutler et al. | 414/281 |
| 6,390,754 B1 | | 5/2002 | Yamaga et al. | 414/217 |
| 6,632,068 B1 | * | 10/2003 | Zinger et al. | 414/800 |
| 6,729,823 B1 | * | 5/2004 | Sakata et al. | 414/217 |

* cited by examiner

*Primary Examiner*—Eileen D. Lillis
*Assistant Examiner*—Charles A. Fox
(74) *Attorney, Agent, or Firm*—Ostrolenk, Faber, Gerb & Soffen, LLP

(57) ABSTRACT

A loader includes a receiving section for receiving a FOUP (front opening unified pod), an opener for transporting substrates out of the FOUP, and a transport robot for transporting the FOUP between the receiving section and the opener. When the opener transports the substrates out of the FOUP, the FOUP is placed on a holding table. The holding table is formed with a notch permitting a transport arm of the transport robot to pass through vertically. Thus, the downward passage of the transport arm with the FOUP held thereon through the notch allows the direct transfer of the FOUP from the transport arm to the holding table. This reduces the time required for the FOUP transfer operation, to provide a high throughput, thereby providing a substrate transfer apparatus capable of achieving a high throughput.

8 Claims, 10 Drawing Sheets

Fig. A

Fig. B (Zinger et al)

SUBSTRATE TRANSFER APPARATUS, SUBSTRATE PROCESSING APPARATUS AND HOLDING TABLE

BACKGROUND OF THE INVENTION

1. Field of the Invention

The present invention relates to techniques for receiving a container for storing semiconductor substrates (or wafers), glass substrates for LCD devices, glass substrates for photomasks, substrates for optical disks (hereinafter referred to as "substrates"), and for transporting the substrates into and out of the container.

2. Description of the Background Art

Conventionally, unprocessed substrates stored in carriers are transported from outside into a substrate processing apparatus for performing a surface preparation such as an etching process on substrates. The carriers include an OC (open cassette) of the type wherein part of the container thereof is open to the outer atmosphere, and a FOUP (front opening unified pod) of the type wherein the container thereof is enclosed or sealed.

When the FOUP-type cassette (referred to simply as a "FOUP" hereinafter) is used to transport substrates between apparatuses, the substrates are transported while being enclosed in the FOUP. Thus, the cleanliness of the substrates is maintained even if particles and the like are present in the ambient atmosphere. This eliminates the need to make so high the cleanliness in a cleanroom in which the substrate processing apparatus is installed, to reduce costs required for the cleanroom.

Figure 10:
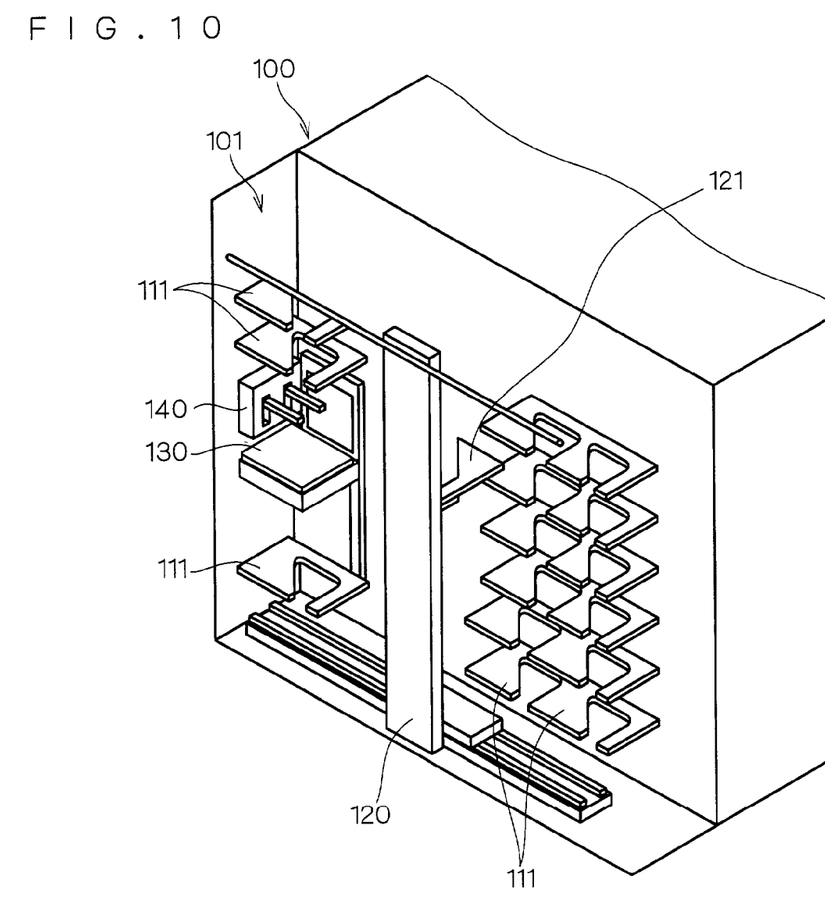
FIG. 10 is a perspective view of a conventional substrate transfer apparatus for a FOUP.

Such a FOUP is received in a purpose-built substrate transfer apparatus incorporated in the substrate processing apparatus. At the substrate transfer apparatus, unprocessed substrate are removed out of the FOUP into the substrate processing apparatus, and processed substrates are collected into the FOUP. FIG. 10 is a perspective view of the conventional substrate transfer apparatus for the FOUP.

The substrate transfer apparatus 101 is incorporated as a loader in a substrate processing apparatus 100, and has the functions of receiving the FOUP with unprocessed substrates stored therein, and loading the substrates from the FOUP into the substrate processing apparatus 100. The substrate transfer apparatus 101 comprises a plurality of shelves 111, a transport robot 120, a holding table 130, and a lifter 140.

Each of the shelves 111 can receive one FOUP thereon. The FOUP transported from outside the substrate processing apparatus 100 into the substrate transfer apparatus 101 is received on one of the plurality of shelves 111.

The holding table 130 can place and hold one FOUP thereon. By opening the FOUP placed on the holding table 130, unprocessed substrates are removed out of the FOUP and loaded into the main body of the substrate processing apparatus 100.

The transport robot 120 includes a transport arm 121, and is capable of moving along the width of the substrate processing apparatus 100. The transport arm 121 is vertically movable with respect to the transport robot 120. Thus, the transport robot 120 enables the transport arm 121 to gain access to the holding table 130 and each of the plurality of shelves 111. The transport robot 120 transports the FOUP with unprocessed substrates stored therein from one of the plurality of shelves 111 to the holding table 130, and transports the empty FOUP out of which the substrates are removed from the holding table 130 to one of the plurality of shelves 111.

When the transport robot 120 transports the FOUP, the transport arm 121 supports the bottom portion of the FOUP from beneath. This is because transporting the FOUP suspended by the transport robot 120 which grasps a flange provided on the top portion of the FOUP does not allow quick increase and reduction in transport speed of the FOUP in terms of the strength of the flange, and accordingly does not allow high-speed transport of the FOUP.

Unfortunately, when the transport arm 121 supports the bottom portion of the FOUP, it is impossible to for the transport arm 121 to place the FOUP directly onto the holding table 130. For this reason, the FOUP supported from beneath by the transport arm 121 is temporarily transferred to the lifter 140 in the background art technique. The lifter 140 can grasp the flange provided on the top portion of the FOUP to hold the FOUP suspended thereby. The lifter 140 is movable up and down in the vertical direction over the holding table 130. Thus, after receiving the FOUP from the transport robot 120, the lifter 140 waits until the transport robot 120 moves to cause the transport arm 121 to shunt out of the space between the FOUP and the holding table 130, and then moves the FOUP held by the lifter 140 downwardly to place the FOUP on the holding table 130. Thereafter, the FOUP placed on the holding table 130 is opened, and unprocessed substrates are removed out of the FOUP and loaded into the main body of the substrate processing apparatus 100.

The above-mentioned procedure is reversed for the transport of an empty FOUP out of which substrates are removed from the holding table 130 to one of the shelves 111. Specifically, after the lifter 140 temporarily holds and lifts the empty FOUP, the transport robot 120 gains access to the holding table 130, and the FOUP is transferred from the lifter 140 to the transport arm 121 of the transport robot 120. Then, the lifter 140 releases the grasp of the FOUP, and the transport robot 120 to which the FOUP is transferred gains access to one of the shelves 111.

In the background art technique, as described above, it is impossible for the transport robot 120 to place the FOUP directly onto the holding table 130 and to receive the FOUP directly from the holding table 130. Thus, the transfer of the FOUP between the transport robot 120 and the holding table 130 must be carried out temporarily via the lifter 140. Therefore, the transfer of the FOUP between the transport robot 120 and the holding table 130 requires time for the lifter 140 to operate and time for the transport robot 120 to shunt, resulting in decrease in throughput.

SUMMARY OF THE INVENTION

The present invention is intended for a substrate transfer apparatus for receiving a container for storing at least one substrate therein, and for performing one of a first transport process and a second transport process, the first transport process transporting the at least one substrate out of the container, the second transport process transporting the at least one substrate into the container.

According to the present invention, the substrate transfer apparatus comprises: a receiving section for receiving the container; a holding table for placing and holding the container thereon during one of the first transport process and the second transport process; and a transport element for transporting the container between the receiving section and the holding table, the transport element having a transport arm movable up and down substantially vertically while supporting the container from beneath, the holding table being formed with a notch permitting the transport arm to pass through substantially vertically.

The passage of the transport arm through the notch of the holding table allows the direct transfer of the container between the transport arm and the holding table. This reduces the time required for the container transfer operation, thereby to provide a high throughput.

Preferably, the transport element gains access to the holding table from one side of the holding table, and the notch is open on the one side.

Such an arrangement facilitates the disengagement of the transport arm from the holding table, and eliminates the need to provide a special space for the transport arm to pass through, thereby to permit effective use of this space.

The present invention is also intended for a substrate processing apparatus for performing one of a first transport process and a second transport process, the first transport process transporting at least one substrate out of a container for storing the at least one substrate therein, the second transport process transporting the at least one substrate into the container.

According to the present invention, the substrate processing apparatus comprises: a receiving section for receiving the container; a holding section for placing and holding the container thereon during one of the first transport process and the second transport process; and a transport element movable up and down substantially vertically while supporting the container from beneath and for transporting the container between the receiving section and the holding section, the holding section being formed with a notch for the transport element, the notch permitting the transport element to pass through substantially vertically.

The passage of the transport element through the notch of the holding section allows the direct transfer of the container between the transport element and the holding section. This reduces the time required for the container transfer operation, thereby to provide a high throughput.

According to one aspect of the present invention, the substrate processing apparatus comprises a holding section for placing and holding the container thereon during one of the first transport process and the second transport process, the holding section being formed with a notch for a transport element, the notch permitting the transport element to pass through substantially vertically, the transport element transporting the container between a predetermined site different from the holding section and the holding section.

The passage of the transport element through the notch of the holding section allows the direct transfer of the container between the transport element and the holding section. This reduces the time required for the container transfer operation, thereby to provide a high throughput.

According to another aspect of the present invention, the substrate processing apparatus comprises: a receiving section for receiving the container; a holding section for placing and holding the container thereon during one of the first transport process and the second transport process; and a transport element movable up and down substantially vertically while supporting the container from beneath and for transporting the container between the receiving section and the holding section, the holding section being formed with a recess for the transport element, the recess permitting the transport element to enter and to move downwardly to below a top surface of the holding section.

The transport element entering the recess of the holding section and moving downwardly to below the top surface of the holding section allows the direct transfer of the container between the transport element and the holding section. This reduces the time required for the container transfer operation, thereby to provide a high throughput.

According to still another aspect of the present invention, the substrate processing apparatus comprises: a receiving section for receiving the container; a holding section for placing and holding the container thereon during one of the first transport process and the second transport process; and a transport element movable up and down substantially vertically while supporting the container from beneath and for transporting the container between the receiving section and the holding section, the holding section being formed with a passage portion for the transport element, the passage portion permitting the transport element to pass substantially vertically.

The transport element passing the passage portion of the holding section allows the direct transfer of the container between the transport element and the holding section. This reduces the time required for the container transfer operation, thereby to provide a high throughput.

The present invention is also intended for a holding table for placing and holding thereon a container for storing at least one substrate therein during one of a first transport process and a second transport process, the first transport process transporting the at least one substrate out of the container, the second transport process transporting the at least one substrate into the container.

It is therefore an object of the present invention to provide a substrate transfer apparatus and a substrate processing apparatus capable of providing a high throughput, and a holding table for use in these apparatuses.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is an external view, in perspective, of a substrate processing apparatus with a substrate transfer apparatus incorporated therein according to the present invention;

DESCRIPTION OF THE PREFERRED EMBODIMENTS

Preferred embodiments according to the present invention will now be described in detail with reference to the drawings.

<1. First Preferred Embodiment>

FIG. 1 is an external view, in perspective, of a substrate processing apparatus with a substrate transfer apparatus incorporated therein according to the present invention. For the sake of definiteness of directions relative to each other, FIG. 1 and its subsequent figures include an XYZ rectangular coordinate system, as required, which defines the direction of the Z axis as the vertical direction and the X-Y plane as the horizontal plane.

The substrate processing apparatus 1 is an apparatus for sequentially performing an etching process using a liquid chemical such as hydrofluoric acid, a rinsing process using pure water, and other processes upon a set of substrates (or a lot). The substrate processing apparatus 1 has a main body containing a liquid chemical bath for storing the liquid chemical, and a rinsing bath for storing the pure water. The substrate processing apparatus 1 is provided with a loader 10 on its first end, and an unloader 90 on its second end opposite from the first end. Both of the loader 10 and the unloader 90 serve as the substrate transfer apparatus according to the present invention, and are similar in construction and function to each other. The difference between the loader 10 and the unloader 90 is such that the loader 10 serves to receive a FOUP with unprocessed substrates stored therein and to transport the unprocessed substrates out of the FOUP into the main body of the substrate processing apparatus 1, whereas the unloader 90 serves to receive an empty FOUP and to transport processed substrates out of the main body of the substrate processing apparatus 1 into the FOUP.

The loader 10 for loading unprocessed substrates into the main body of the substrate processing apparatus 1 will be detailed as an example of the substrate transfer apparatus according to the present invention. The loader 10 has an outer wall formed with inlet openings 11 and 12. A FOUP with unprocessed substrates stored therein is transported by a load robot not shown through the inlet opening 11 or 12 into the loader 10.

Figure 2:
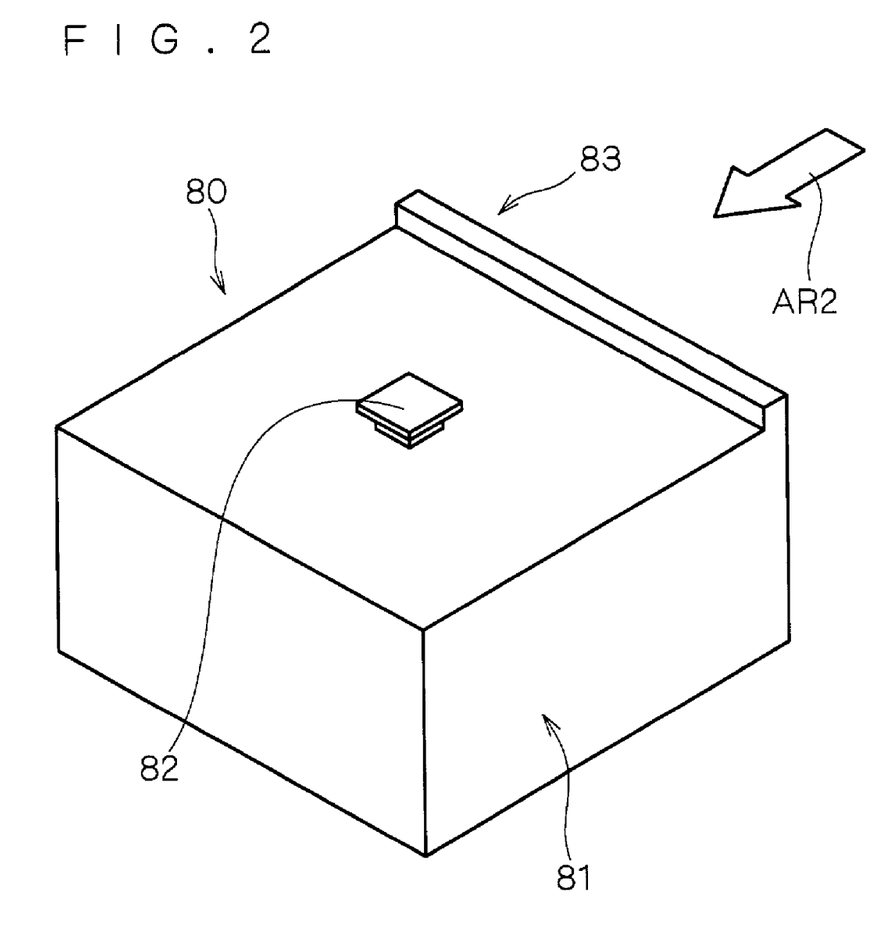
FIG. 2 is an external view, in perspective, of a FOUP.

The FOUP will be described. FIG. 2 is an external view, in perspective, of the FOUP. The FOUP 80 has an enclosure 81, and a flange 82 formed on the top portion of the enclosure 81. The FOUP 80 is held suspended by grasping the flange 82. A cover 83 is provided on one surface (or a surface as seen in the direction of the arrow AR2 of FIG. 2) of the enclosure 81. The cover 83 is provided with a lock mechanism for locking the enclosure 81. Functioning the lock mechanism, with the cover 83 mounted to the enclosure 81, secures the cover 83 to the enclosure 81 to provide a closed space enclosed in the enclosure 81. Releasing the lock mechanism allows the cover 83 to be removed from the enclosure 81. With the cover 83 removed from the enclosure 81 to open the FOUP 80, substrates may be removed out of and inserted into the enclosure 81. For example, 25 or 13 substrates with their major surfaces extending in the horizontal or vertical direction are stored in the enclosure 81.

In general, when the FOUP 80 is transported inside and outside the loader 10, the cover 83 is mounted to the enclosure 81 with the lock mechanism functioned or with the enclosed space provided in the enclosure 81. This maintains a high cleanliness in the FOUP 80 independently of the cleanliness in the cleanroom in which the substrate processing apparatus 1 is installed.

Figure 3:
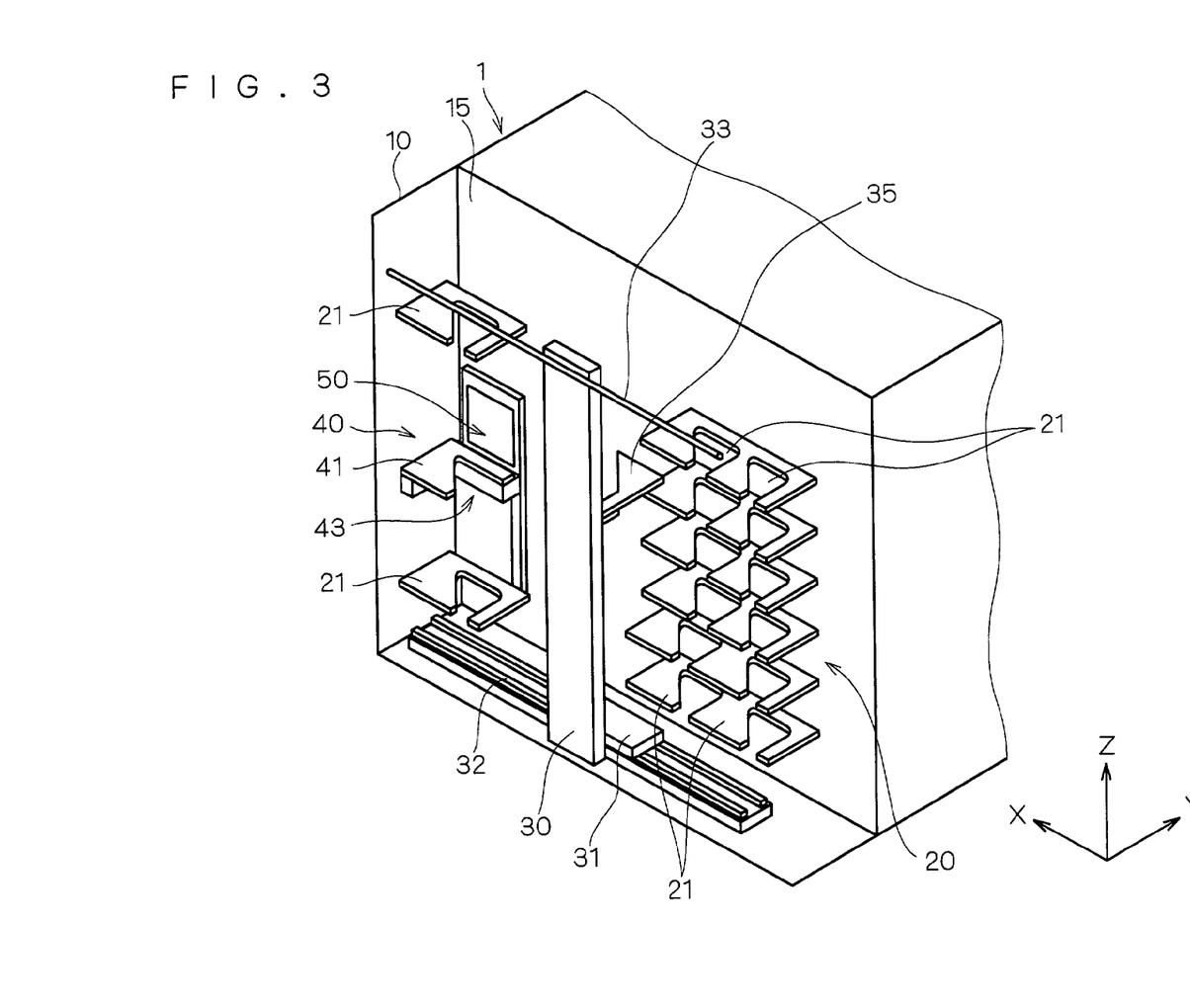
FIG. 3 is a perspective view showing a structure of a loader of the substrate processing apparatus of FIG. 1.

FIG. 3 is a perspective view showing a structure of the loader 10. The loader 10 primarily comprises a receiving section 20 for receiving the FOUP 80, an opener 40 for opening the FOUP 80 to remove unprocessed substrates out of the FOUP 80, and a transport robot 30 for transporting the FOUP 80 between the receiving section 20 and the opener 40. The loader 10 is connected to the main body of the substrate processing apparatus 1, with a partition 15 therebetween. The use of the FOUP 80 as a carrier might decrease the cleanliness to some extent in an atmosphere down to the interior of the loader 10. Even in such a case, however, the partition 15 provides isolation between the atmosphere in the interior of the loader 10 and the atmosphere in the main body of the substrate processing apparatus 1, thereby to maintain a high cleanliness in the main body of the substrate processing apparatus 1.

The receiving section 20 includes a total of 14 shelves 21. One of the shelves 21 is provided over the opener 40, and another is provided under the opener 40, the remaining 12 shelves being arranged in two lines each including six shelves and extending in the vertical direction (or along the Z axis). Each of the shelves 21 is capable of receiving one FOUP 80 placed thereon. It should be noted that each of the shelves 21 can receive either of the FOUP 80 with unprocessed substrates stored therein and the empty FOUP 80 out of which substrates are removed.

The transport robot 30 includes a transport arm 35 and a horizontal driver 31. The loader 10 includes a rail 32 and a guide rail 33 both extending along the X axis. The horizontal driver 31 is fixedly provided on the lower end of the transport robot 30 and is movable on the rail 32 along the X axis. The upper end of the transport robot 30 is slidably connected to the guide rail 33. As the horizontal driver 31 moves on the rail 32 along the X axis, the entire transport robot 30 moves along the X axis.

The transport arm 35 is attached to the transport robot 30 and is movable up and down in the vertical direction (along the Z axis) with respect to the transport robot 30 by a vertical driver not shown. Since the entire transport robot 30 is movable along the X axis and the transport arm 35 is movable along the Z axis with respect to the transport robot 30, the transport arm 35 accordingly can move freely in the X-Z plane. Therefore, the transport robot 30 allows the transport arm 35 to gain access to any one of the shelves 21 and to the opener 40.

Figure 4:
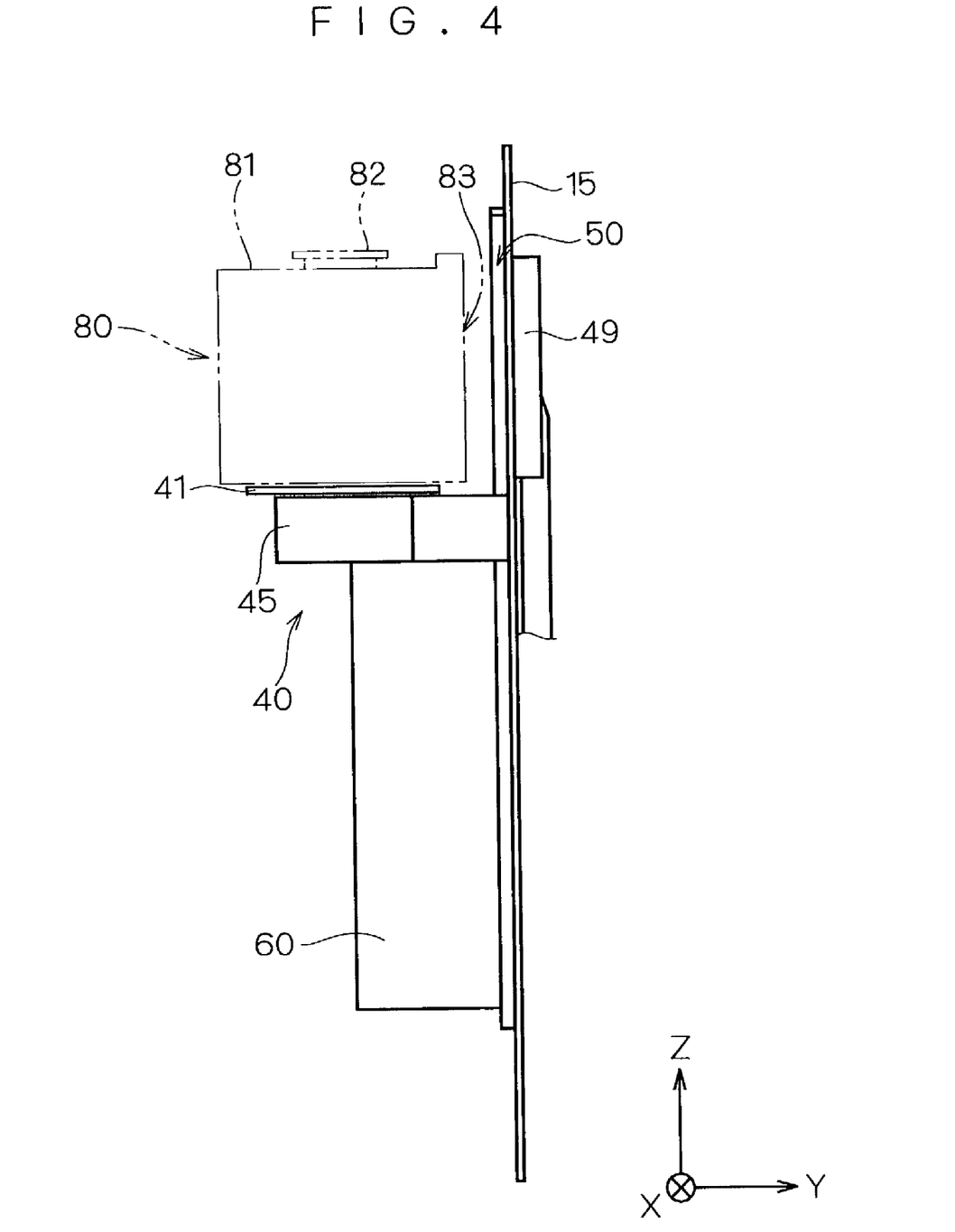
FIG. 4 is a side view of an opener shown in FIG. 3, as viewed in the X direction.
Figure 5:
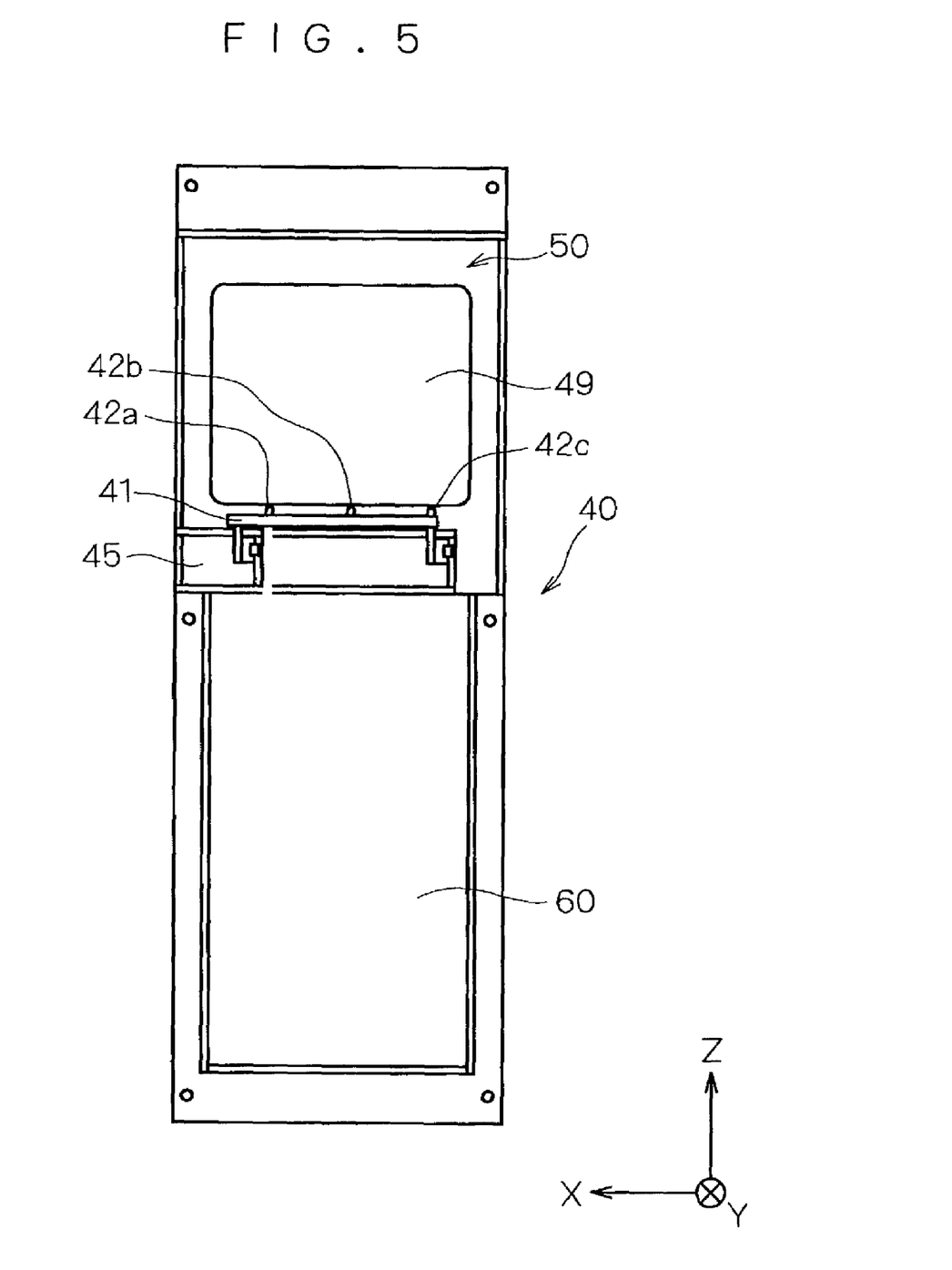
FIG. 5 is a front view of the opener shown in FIG. 3, as viewed in the Y direction.
Figure 6:
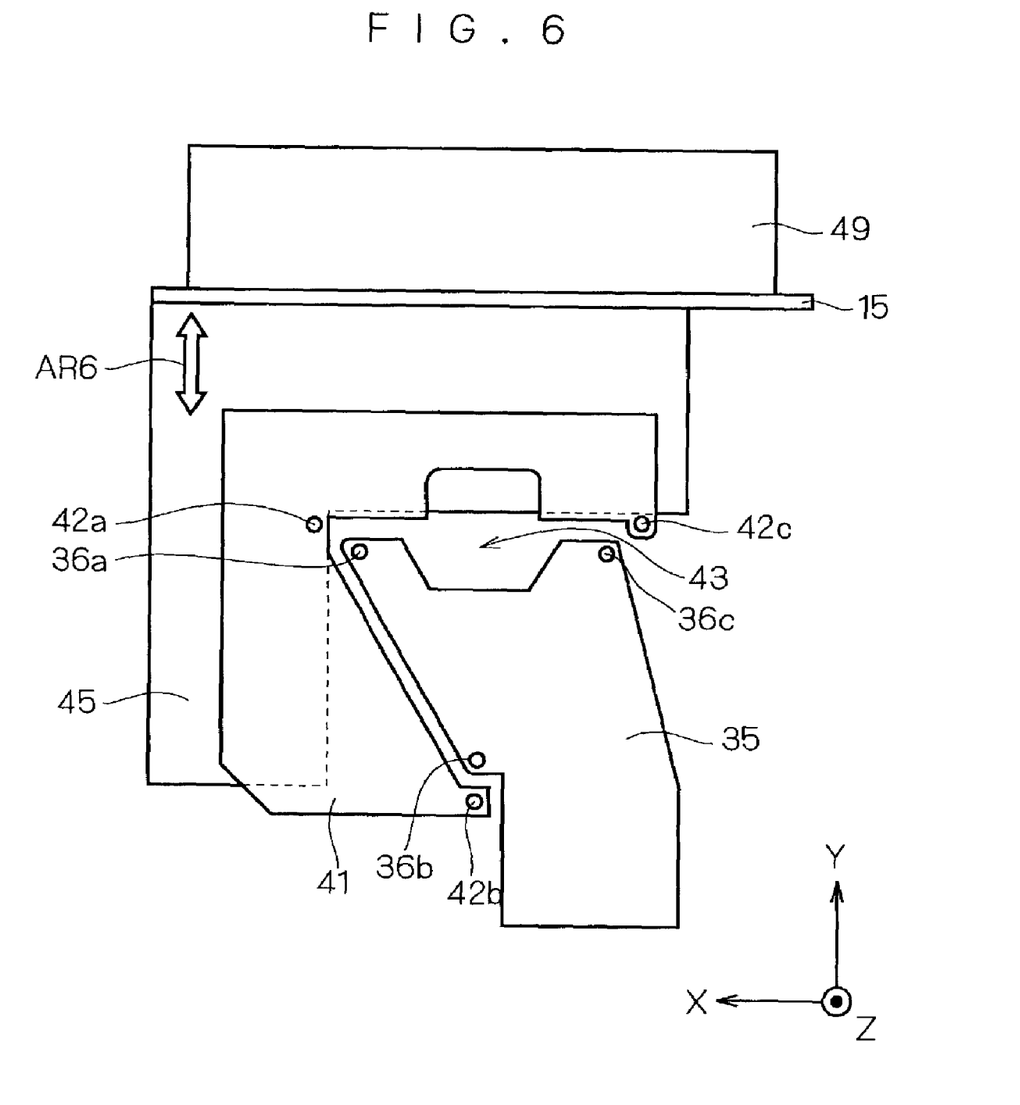
FIG. 6 is a plan view of the opener shown in FIG. 3, as viewed in the Z direction.

The opener 40 functions to place the FOUP 80 thereon to remove the cover 83 from the FOUP 80. FIG. 4 is a side view of the opener 40, as viewed in the X direction. FIG. 5 is a front view of the opener 40, as viewed in the Y direction. FIG. 6 is a plan view of the opener 40, as viewed in the Z direction.

The opener 40 includes a holding table 41, a stage 45, and an attaching/detaching section 49. The holding table 41 is provided on the top surface of the stage 45. The holding table 41 is slidably movable back and forth in the Y direction, as indicated by the arrow AR6 of FIG. 6, by a slide mechanism (not shown) provided in the stage 45. Three support pins 42a, 42b and 42c are mounted upright on the top surface of the holding table 41. The holding table 41 can place thereon the FOUP 80 in a substantially horizontal position at three points of the three support pins 42a, 42b and 42c. The holding table 41 places the FOUP 80 thereon when unprocessed substrates are transported out of the FOUP 80. The shape of the holding table 41 will be described later.

The attaching/detaching section 49 is provided on the opposite side, from the holding table 41, of an opening 50 formed in the partition 15 lying between the loader 10 and the main body of the substrate processing apparatus 1. The attaching/detaching section 49 is capable of closing and opening the lock mechanism of the cover 83 of the FOUP 80 to attach and detach the cover 83 to and from the FOUP 80. The opening 50 is the sole opening formed in the partition 15. The attaching/detaching section 49 is movable back and forth along the Y axis and movable up and down along the Z axis by a driver not shown.

Substrates are removed out of the FOUP 80 in a manner to be described below. First, the holding table 41 with the FOUP 80 placed thereon moves in the +Y direction to cause an end surface (on which the cover 83 is mounted) of the FOUP 80 to enter the opening 50, thereby bringing the cover 83 into contact with the attaching/detaching section 49. The attaching/detaching section 49 releases the lock mechanism of the cover 83 to detach the cover 83 from the FOUP 80. Next, while holding the cover 83, the attaching/detaching section 49 moves backwardly in the +Y direction and then vertically downwardly. In this process, as the attaching/detaching section 49 moves in the above-mentioned manner, the cover 83 is disengaged from the FOUP 80, and moves downwardly through the opening 50. After the FOUP 80 is thus opened, a substrate transfer robot provided in the main body of the substrate processing apparatus 1 gains access to the interior of the FOUP 80 placed on the holding table 41 to remove the unprocessed substrates out of the FOUP 80.

The above-mentioned procedure is reversed after all of the substrates are removed out of the FOUP 80. Specifically, while holding the cover 83, the attaching/detaching section 49 moves vertically upwardly and then forwardly in the -Y direction. In this process, as the attaching/detaching section 49 moves in the above-mentioned manner, the cover 83 passes through the opening 50, and is fitted on the enclosure 81 of the FOUP 80. Next, the attaching/detaching section 49 causes the lock mechanism of the cover 83 to function to mount the cover 83 to the FOUP 80. Thereafter, the holding table 41 with the FOUP 80 placed thereon moves in the -Y direction to disengage the end surface of the FOUP 80 from the opening 50.

In this preferred embodiment, the holding table 41 has a notch 43 (See FIG. 6) through which the transport arm 35 can pass in the vertical direction. More specifically, the notch 43 of the holding table 41 is generally complementary or similar in shape to the transport arm 35. The stage 45 is accordingly in L shape to enable the transport arm 35 to smoothly pass through the notch 43 in the vertical direction.

Three support pins 36*a*, 36*b* and 36*c* are mounted upright on the top surface of the transport arm 35. The transport arm 35 can support the FOUP 80 in a substantially horizontal position from beneath at three points of the three support pins 36*a*, 36*b* and 36*c*, and move up and down in the vertical direction while supporting the FOUP 80 thereon.

As the transport arm 35 supporting the FOUP 80 in the substantially horizontal position from beneath moves vertically downwardly from over the holding table 41 and passes through the notch 43 of the holding table 41, the FOUP 80 is transferred from the support pins 36*a*, 36*b* and 36*c* of the transport arm 35 to the support pins 42*a*, 42*b* and 42*c* of the holding table 41. Thus, the first preferred embodiment features the direct transfer of the FOUP 80 from the transport arm 35 to the holding table 41.

Further, as shown in FIG. 6, the support pins 36*a*, 36*b* and 36*c* of the transport arm 35 are disposed inwardly from the support pins 42*a*, 42*b* and 42*c* of the holding table 41. In other words, the positions in which the transport arm 35 supports the FOUP 80 are inward, at the bottom surface of the FOUP 80, from the positions in which the holding table 41 places and holds the FOUP 80 thereon.

Typically, an ID label for identification is attached to the front surface (opposite from the cover 83) of the FOUP 80. The opener 40 is provided with a reader for reading the ID label. The position in which the ID label is attached to the FOUP 80 is defined as the center of the front surface of the FOUP 80 by the standards. However, such an arrangement that the positions in which the transport arm 35 supports the FOUP 80 are inward from the positions in which the holding table 41 places the FOUP 80 thereon allows the reader to be fixedly provided on the holding table 41 forward of the support pin 42*b* (in the -Y direction). This arrangement obviates the danger of interference between the reader and the transport arm 35.

The operation of the loader 10 having the above-mentioned construction will be described. The FOUP 80 with unprocessed substrates stored therein is transported through the inlet opening 11 or 12 into the loader 10, and is received on one of the 14 shelves 21. For loading the unprocessed substrates out of the FOUP 80 into the main body of the substrate processing apparatus 1, the transport robot 30 initially gains access to the one shelf 21 and the transport arm 35 supports the FOUP 80 from beneath. As described above, the transport arm 35 does not grasp the flange 82 of the FOUP 80 but supports the FOUP 80 from beneath. This allows the high-speed transport of the FOUP 80 by the transport robot 30.

Next, the transport robot 30 positions the transport arm 35 still supporting the FOUP 80 over the holding table 41 or, more exactly, directly over the notch 43 of the holding table 41. As the transport robot 30 moves the transport arm 35 vertically downwardly through the notch 43, the FOUP 80 is directly transferred from the transport arm 35 to the holding table 41. Thereafter, the holding table 41 moves in the +Y direction, and the cover 83 of the FOUP 80 is removed so that the substrates are removed out of the FOUP 80, in a manner as discussed above. The substrates transported out of the FOUP 80 are loaded into the main body of the substrate processing apparatus 1 and subjected to predetermined processing.

After all of the substrates are removed out of the FOUP 80, the cover 83 is mounted again to the FOUP 80, and the holding table 41 moves in the -Y direction. Then, the transport robot 30 positions the transport arm 35 under the holding table 41 or, more exactly, directly under the notch 43 of the holding table 41. Next, as the transport robot 30 moves the transport arm 35 vertically upwardly through the notch 43, the empty FOUP 80 is directly transferred from the holding table 41 to the transport arm 35. Thereafter, the transport robot 30 gains access to one of the shelves 21 to transfer the empty FOUP 80 from the transport arm 35 to the one shelf 21. The empty FOUP 80 is transported through the inlet opening 11 or 12 to the outside of the loader 10 again. Thus, a series of processes in the loader 10 is completed. Similar processes are repeated for other FOUPs 80.

With this arrangement, the passage of the transport arm 35 of the transport robot 30 through the notch 43 of the holding table 41 allows the direct transfer of the FOUP 80 between the transport arm 35 and the holding table 41. This saves the time having been conventionally required for the lifter 140 to operate and for the transport robot 120 to shunt, to reduce the time required for the transfer operation of the FOUP 80, thereby providing a high throughput.

Additionally, the first preferred embodiment eliminates the need to provide the conventional lifter 140 for transfer of the FOUP 80 between the transport robot 30 and the holding table 41, thereby to reduce the costs of the loader 10.

Further, in the first preferred embodiment, the transport robot 30 gains access to the holding table 41 from a first side (-X side, or righthand side as viewed in FIG. 6) of the holding table 41. As clearly illustrated in FIG. 6, the notch 43 of the holding table 41 is open on the first side (-X side). Thus, when the transport robot 30, after moving the transport arm 35 downwardly to transfer the FOUP 80 from the transport arm 35 to the holding table 41, moves the transport arm 35 downwardly slightly to a level at which the transport arm 35 does not contact the bottom surface of the FOUP 80 and then moves the transport arm 35 in the −X direction, the transport arm 35 can pass through the open spacing of the notch 43 and disengage from the opener 40. Supposing the notch 43 is not open on the first side (−X side), it is necessary that, after transferring the FOUP 80 from the transport arm 35 to the holding table 41, the transport robot 30 moves the transport arm 35 downwardly at least to under the stage 45 to prevent interference with the holding table 41, and then moves the transport arm 35 in the −X direction to disengage the transport arm 35 from the opener 40. In this case, a special space must be provided under the stage 45 for the transport arm 35 to pass through.

On the other hand, making the notch 43 of the holding table 41 open on the first side (−X side) as in the first preferred embodiment obviates the danger of interference between the transport arm 35 and the holding table 41 even if the transport robot 30 moves horizontally in the −X direction when the transport arm 35 is at the same level as the holding table 41. This eliminates the need to provide the special space under the stage 45 for the transport arm 35 to pass through for the purpose of disengaging the transport arm 35 from the opener 40, thereby to permit effective use of this space. For example, a controller 60 of the loader 10 is disposed in this space in the first preferred embodiment.

A direction in which the first side is viewed from the holding table 41 (or in which the transport arm 35 gains access to the holding table 41) is the X direction, and a carry-out direction in which the substrates are transported out of the FOUP 80 through the opening 50 is the +Y direction. A carry-in direction in which the substrates are transported into the FOUP 80 is the −Y direction. Thus, the direction in which the first side is viewed from the holding table 41 is perpendicular to the carry-out direction in which the substrates are transported out of the FOUP 80 or the carry-in direction in which the substrates are transported into the FOUP 80. This means that the carry-out direction in which the substrates are transported out of the FOUP 80 through the opening 50 or the carry-in direction in which the substrates are transported into the FOUP 80 is perpendicular to the direction in which the transport arm 35, after transferring the FOUP 80 to the holding table 41, is disengaged from and moved away from the opener 40.

If the carry-out direction of the substrates transported out of the FOUP 80 or the carry-in direction of the substrates transported into the FOUP 80 is the same as the direction in which the transport arm 35 is disengaged from and moved away from the opener 40, the depth of the loader 10 (or the dimension of the loader 10 in the Y direction) must be increased by the amount of movement of the transport arm 35. However, the above-mentioned arrangement in which the carry-out direction of the substrates transported out of the FOUP 80 or the carry-in direction of the substrates transported into the FOUP 80 is perpendicular to the direction in which the transport arm 35 is disengaged from and moved away from the opener 40 as in the first preferred embodiment reduces the depth of the loader 10 to suppress the increase in footprint.

The loader 10 according to the first preferred embodiment has been described above. The unloader 90 (See FIG. 1) is similar in construction and function to the loader 10. However, since the unloader 90 is provided to transport processed substrates into the FOUP 80, the transport robot 30 transports the empty FOUP 80 from one of the shelves 21 to the holding table 41. The holding table 41 places and holds the FOUP 80 thereon when the processed substrates are transported into the FOUP 80. Then, the transport arm 35 of the transport robot 30 receives from the holding table 41 the FOUP 80 with the processed substrates having been transported therein, and transports the FOUP 80 to one of the shelves 21.

Also, the unloader 90 may include the holding table 41 provided with the notch 43 similar to that of the loader 10 to allow the direct transfer of the FOUP 80 between the transport arm 35 and the holding table 41. This reduces the time required for the transfer operation of the FOUP 80 to provide a high throughput. The unloader 90 is also similar to the loader 10 in reducing the costs thereof and in eliminating the need to provide a special space for the transport arm 35 to pass through.

<2. Second Preferred Embodiment>

Figure 7:
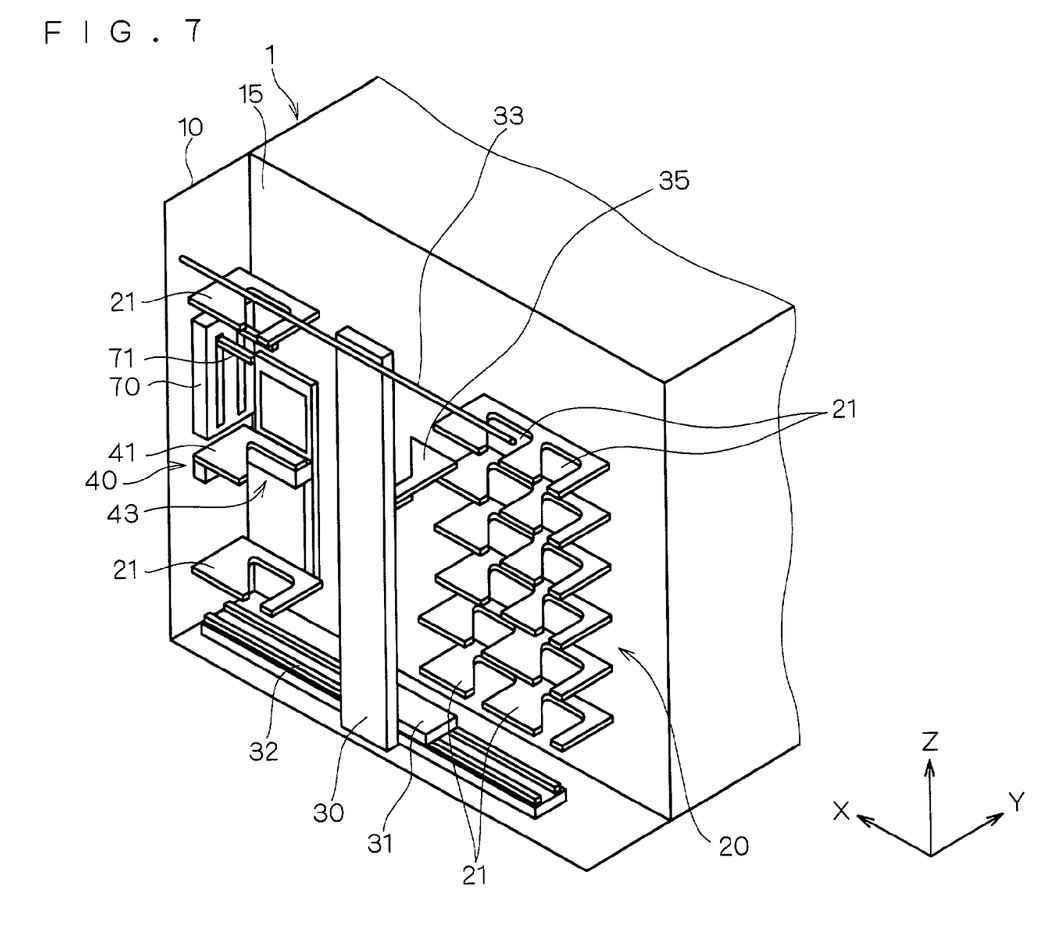
FIG. 7 is a perspective view showing a structure of the loader according to a second preferred embodiment of the present invention.

Next, a second preferred embodiment according to the present invention will be described. FIG. 7 is a perspective view showing a structure of the loader 10 according to the second preferred embodiment. The loader 10 of the second preferred embodiment differs from that of the first preferred embodiment in comprising a lifter 70. The remaining structure of the second preferred embodiment is similar to that of the first preferred embodiment. Like parts are designated by the same reference numerals and are not particularly described.

The lifter 70 is provided over the holding table 41. The lifter 70 includes a pair of lifter arms 71 capable of grasping and releasing the flange 82 (or graspable portion) formed on the top portion of the FOUP 80. The lifter 70 can move the pair of lifter arms 71 up and down in the vertical direction.

As the pair of lifter arms 71 grasp the flange 82 of the FOUP 80 placed on the holding table 41 and move upwardly, the FOUP 80 suspended by the pair of lifter arms 71 also moves upwardly. Thus, the FOUP 80 is transferred from the holding table 41 to the lifter 70. In the reverse procedure, when the pair of lifter arms 71 release the grasp of the flange 82, with the bottom surface of the FOUP 80 in contact with the holding table 41, then the FOUP 80 is transferred from the lifter 70 to the holding table 41.

The lifter 70 serves as a lifting element in the second preferred embodiment. The minimum stroke of the lifter 70 to be ensured is long enough for the transport arm 35 of the transport robot 30 to horizontally pass through a spacing between one FOUP 80 placed on the holding table 41 and another FOUP 80 grasped by the pair of lifter arms 71.

The operation of the loader 10 according to the second preferred embodiment will be described. First, as in the first preferred embodiment, a new FOUP 80 with unprocessed substrates stored therein is transported through the inlet opening 11 or 12 into the loader 10, and is received on one of the 14 shelves 21. Next, the transport robot 30 gains access to the one shelf 21 and the transport arm 35 supports the new FOUP 80 from beneath.

Then, the transport robot 30 transports the new FOUP 80 to the opener 40. In this transport process, if no other FOUP 80 is placed on the holding table 41, the transport robot 30 transfers the new FOUP 80 directly to the holding table 41 as in the first preferred embodiment. On the other hand, if a second FOUP 80 is placed on the holding table 41, the transport robot 30 transfers the new FOUP 80 to the lifter 70. The pair of lifter arms 71 grasp the flange 82 formed on the top portion of the new FOUP 80 supported by the transport arm 35 from beneath, whereby the new FOUP 80 is transferred from the transport robot 30 to the lifter 70. There is no apprehension of interference between the transport arm 35 and the pair of lifter arms 71 during this transfer operation.

When the second FOUP 80 (corresponding to a second container) is placed on the holding table 41, unprocessed substrates are being transported out of the second FOUP 80 into the main body of the substrate processing apparatus 1. During this transport operation, the new FOUP 80 (corresponding to a first container) with unprocessed substrates stored therein is transferred from the transport robot 30 to the lifter 70. In other words, while the new FOUP 80 is held by the lifter 70, the substrates are transported out of the second FOUP 80 placed on the holding table 41. The lifter 70 is on standby while holding the new FOUP 80.

After the transport of the substrates out of the second FOUP 80 is completed, the transport robot 30 receives the empty second FOUP 80 from the holding table 41 to transport the empty second FOUP 80 to one of the shelves 21, and the lifter 70 moves the pair of lifter arms 71 downwardly to transfer the new FOUP 80 to the holding table 41. Then, the substrates start to be transported out of the new FOUP 80 placed on the holding table 41, and the transport robot 30 having carried the empty second FOUP 80 onto the one shelf 21 transports a third new FOUP 80 from one of the shelves 21 to the lifter 70. Similar operations are subsequently repeated.

Thus, as soon as the transport robot 30 removes from the holding table 41 the empty second FOUP 80 out of which substrates have been transported, the lifter 70 transfers the new FOUP 80 with the unprocessed substrates stored therein to the holding table 41. The process of carrying the empty FOUP 80 onto one of the shelves 21 and the process of introducing the new FOUP 80 with the unprocessed substrates stored therein onto the opener 40 are performed substantially at the same time. Therefore, the second preferred embodiment requires shorter time for the transfer operation of the FOUP 80 to provide a higher throughput than the first preferred embodiment. The second preferred embodiment is also similar to the first preferred embodiment in eliminating the need to provide a special space for the transport arm 35 to pass through. However, the second preferred embodiment is provided with the lifter 70 to accordingly increase the costs, as compared with the first preferred embodiment. It is therefore desirable to make a comparison between the degree of the increase in costs and the degree of improvement in throughput to provide an apparatus configuration which meets required specifications.

The loader 10 according to the second preferred embodiment has been described above. As in the first preferred embodiment, the unloader 90 (See FIG. 1) is similar in construction and function to the loader 10 according to the second preferred embodiment. In the unloader 90, when a new empty FOUP 80 (corresponding to a first container) is transported by the transport robot 30 and a second FOUP 80 (corresponding to a second container) is placed on the holding table 41, processed substrates are being transported into the second FOUP 80 from the main body of the substrate processing apparatus 1. During this transport operation, the new empty FOUP 80 is transferred from the transport robot 30 to the lifter 70. In other words, while the new empty FOUP 80 is held by the lifter 70, the substrates are transported into the second FOUP 80 placed on the holding table 41. The lifter 70 is on standby while holding the new empty FOUP 80.

After the transport of the substrates into the second FOUP 80 is completed, the transport robot 30 receives the second FOUP 80 with the processed substrates stored therein from the holding table 41 to transport the second FOUP 80 to one of the shelves 21, and the lifter 70 moves the pair of lifter arms 71 downwardly to transfer the new empty FOUP 80 to the holding table 41. Then, the substrates start to be transported into the new empty FOUP 80 placed on the holding table 41, and the transport robot 30 having carried the second FOUP 80 onto the one shelf 21 transports a third new empty FOUP 80 from one of the shelves 21 to the lifter 70. Similar operations are subsequently repeated.

Thus, as soon as the transport robot 30 removes from the holding table 41 the second FOUP 80 into which substrates have been transported, the lifter 70 transfers the new empty FOUP 80 to the holding table 41. Therefore, the second preferred embodiment requires shorter time for the transfer operation of the FOUP 80 to provide a higher throughput.

<3. Third Preferred Embodiment>

Figure 8:
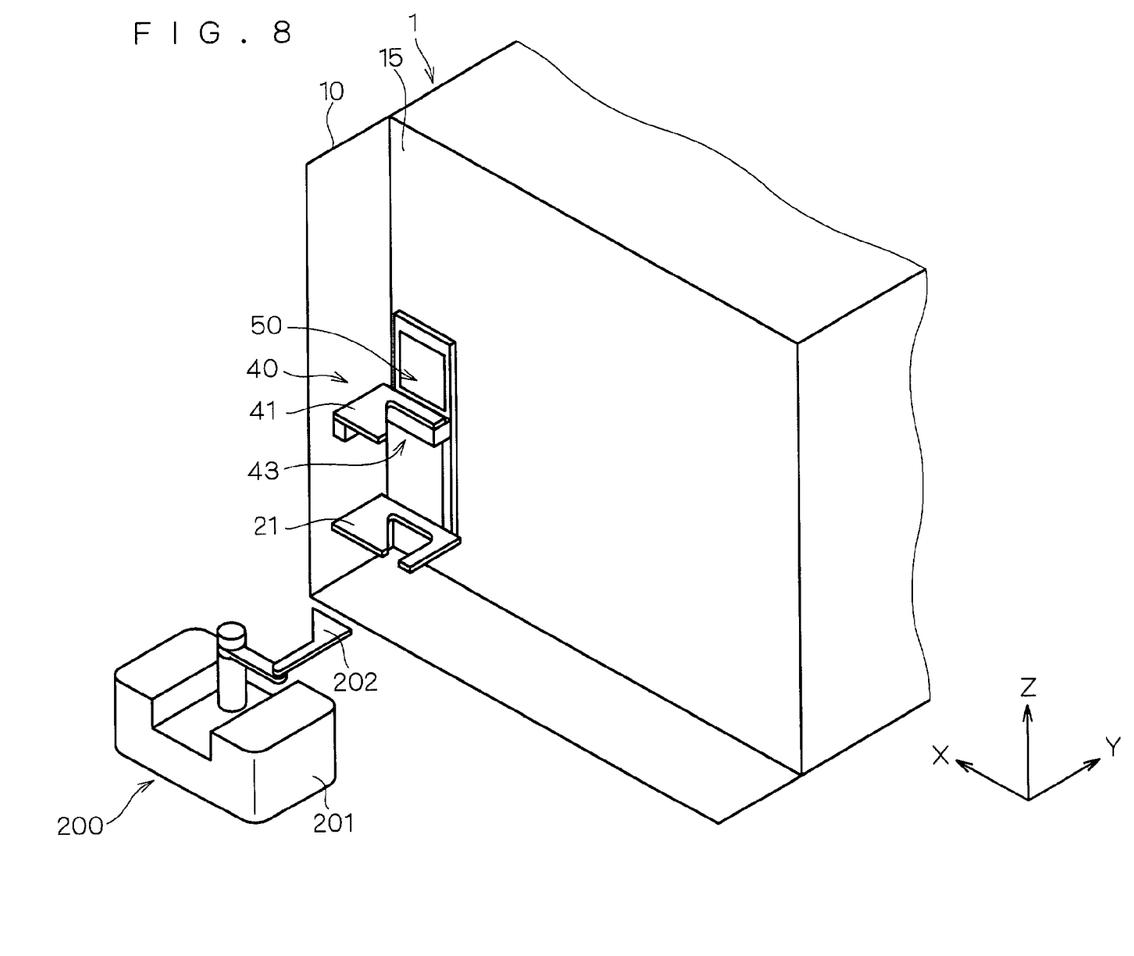
FIG. 8 is a perspective view showing a structure of the loader according to a third preferred embodiment of the present invention.

Next, a third preferred embodiment according to the present invention will be described. FIG. 8 is a perspective view showing a structure of the loader 10 according to the third preferred embodiment. The loader 10 of the third preferred embodiment differs from that of the first preferred embodiment in that an AGV (Automatic Guided Vehicle) 200 outside the substrate processing apparatus transfers a FOUP 80 directly to the opener 40. The remaining structure of the third preferred embodiment is similar to that of the first preferred embodiment. Like parts are designated by the same reference numerals and are not particularly described.

The loader 10 according to the third preferred embodiment does not include the receiving section 20 for receiving the FOUP 80 and the transport robot 30 for transporting the FOUP 80 between the receiving section 20 and the opener 40, but includes only the opener 40 for opening the FOUP 80 to remove unprocessed substrates out of the FOUP 80. In other words, the loader 10 of the first preferred embodiment from which the receiving section 20 and the transport robot 30 are eliminated corresponds to the loader 10 of the third preferred embodiment. It should be noted that the loader 10 according to the third preferred embodiment has only one shelf 21 provided under the holding table 41 for placing the FOUP 80 thereon to adjust a difference between the time for transport of the AGV 200 and the time for the opener 40 to remove substrates out of the FOUP 80.

The AGV 200 travels in a factory wherein the substrate processing apparatus is installed to transport the FOUP 80. The AGV 200 includes a main body 201 having a self-propelled or self-running function, and an articulated robot having a transport arm 202.

An opening (not shown) similar to the inlet openings 11 and 12 of FIG. 1 is formed in an outer wall of the loader 10 and positioned in opposed relation to the holding table 41. The AGV 200 can transfer and remove the FOUP 80 to and from the opener 40 through the opening. The AGV 200 transports the FOUP 80 between a site (e.g., a FOUP 80 collection site in the factory) different from the opener 40 and the opener 40.

The operation of the loader 10 according to the third preferred embodiment will be described. First, with the FOUP 80 supported by the transport arm 202 from beneath, the AGV 200 moves to the front of the opening of the loader 10. Then, the AGV 200 inserts the transport arm 202 through the opening into the loader 10 to position the transport arm 202 over the holding table 41, or, more exactly, directly over the notch 43 of the holding table 41. As the AGV 200 moves the transport arm 202 vertically downwardly through the notch 43, the FOUP 80 is directly transferred from the transport arm 202 to the holding table 41.

After the substrates are transported out of the FOUP 80, the AGV 200 positions the transport arm 202 under the holding table 41 or, more exactly, directly under the notch 43 of the holding table 41. Next, as the AGV 200 moves the transport arm 202 vertically upwardly through the notch 43, the empty FOUP 80 is directly transferred from the holding table 41 to the transport arm 202. Thereafter, the AGV 200 pulls the transport arm 202 out of the opening, and starts moving again while holding the FOUP 80.

With this arrangement, the passage of the transport arm 202 of the AGV 200 through the notch 43 of the holding table 41 allows the direct transfer of the FOUP 80 between the transport arm 202 and the holding table 41. This reduces the time required for the transfer operation of the FOUP 80, thereby providing a high throughput, as in the first preferred embodiment.

The loader 10 according to the third preferred embodiment has been described above. The unloader 90 (See FIG. 1) is similar in construction and function to the loader 10, as in the first preferred embodiment. However, since the unloader 90 is provided to transport processed substrates into the FOUP 80, the AGV 200 transports the empty FOUP 80 to the holding table 41. The holding table 41 places and holds the FOUP 80 thereon when the processed substrates are transported into the FOUP 80. Then, the transport arm 202 of the AGV 200 receives from the holding table 41 the FOUP 80 with the processed substrates having been transported therein, and brings the FOUP 80 to the outside of the apparatus.

<4. Fourth Preferred Embodiment>

Figure 9:
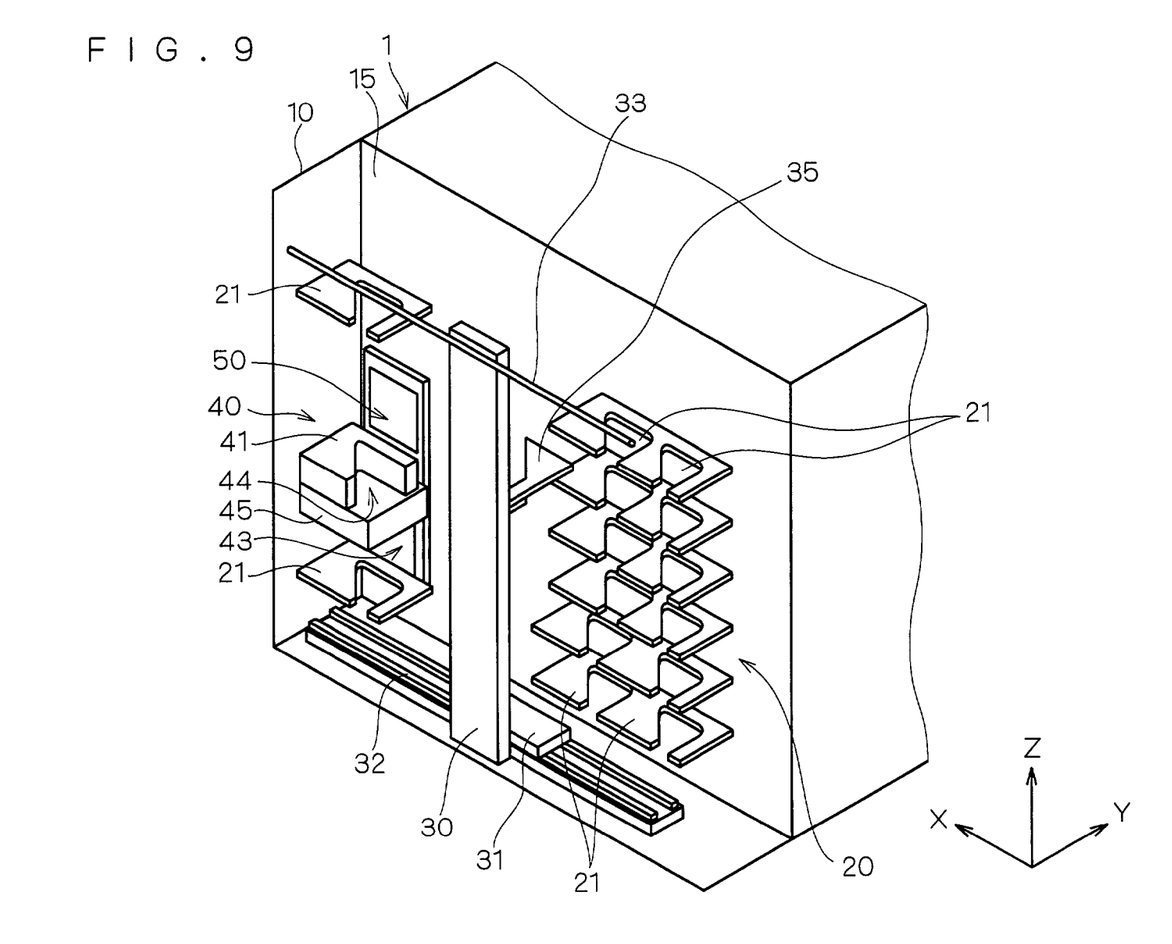
FIG. 9 is a perspective view showing a structure of the loader according to a fourth preferred embodiment of the present invention.

Next, a fourth preferred embodiment according to the present invention will be described. FIG. 9 is a perspective view showing a structure of the loader 10 according to the fourth preferred embodiment. The loader 10 of the fourth preferred embodiment differs from that of the first preferred embodiment in that the stage 45 has the shape of a rectangular parallelepiped to preclude the transport arm 35 from passing from over the holding table 41 to thereunder, that is, in that the holding table 41 is formed with a recess 44 which permits the transport arm 35 to vertically enter but precludes the transport arm 35 from passing therethrough. The remaining structure of the fourth preferred embodiment is similar to that of the first preferred embodiment. Like parts are designated by the same reference numerals and are not particularly described.

According to the fourth preferred embodiment, the holding table 41 is provided with the recess 44 configured to permit the transport arm 35 received therein to move downwardly until at least the top surface of the transport arm 35 is below the top surface of the holding table 41. More specifically, the recess 44 provided in the holding table 41 is generally complementary or similar in shape to the transport arm 35 and has a depth greater than the thickness of the transport arm 35. The shape of the stage 45 is a rectangular parallelepiped. Thus, the transport arm 35 is precluded from vertically passing through the holding table 41.

As in the first preferred embodiment, the transport arm 35 can support the FOUP 80 in a substantially horizontal position from beneath at three points of the three support pins 36a, 36b and 36c, and move up and down in the vertical direction while supporting the FOUP 80 from below. As the transport arm 35 supporting the FOUP 80 in the substantially horizontal position from beneath moves vertically downwardly from over the holding table 41 to enter the recess 44 of the holding table 41 down to below the top surface of the holding table 41, the FOUP 80 is transferred from the support pins 36a, 36b and 36c of the transport arm 35 to the support pins 42a, 42b and 42c of the holding table 41. Thus, the fourth preferred embodiment also features the direct transfer of the FOUP 80 from the transport arm 35 to the holding table 41.

Additionally, as in the first preferred embodiment, the positions in which the transport arm 35 supports the FOUP 80 are inward, at the bottom surface of the FOUP 80, from the positions in which the holding table 41 places and holds the FOUP 80 thereon.

Further, in the fourth preferred embodiment, the transport robot 30 gains access to the holding table 41 from the first side (-X side, or righthand side as viewed in FIG. 9) of the holding table 41. The recess 44 of the holding table 41 is open on the first side (-X side). Thus, when the transport robot 30, after moving the transport arm 35 downwardly to transfer the FOUP 80 from the transport arm 35 to the holding table 41, moves the transport arm 35 downwardly slightly in the recess 44 to a level at which the transport arm 35 does not contact the bottom surface of the FOUP 80, and then moves the transport arm 35 in the -X direction, the transport arm 35 can pass through the open spacing of the recess 44 and disengage from the opener 40.

Therefore, the fourth preferred embodiment also obviates the danger of interference between the transport arm 35 and the holding table 41 even if the transport robot 30 moves horizontally in the -X direction when the transport arm 35 is at the same level as the holding table 41. This eliminates the need to provide the special space under the stage 45 for the transport arm 35 to pass through, thereby to permit effective use of this space.

Moreover, also in the fourth preferred embodiment, the direction in which the first side is viewed from the holding table 41 (or in which the transport arm 35 gains access to the holding table 41) is perpendicular to the carry-out direction in which the substrates are transported out of the FOUP 80 or the carry-in direction in which the substrates are transported into the FOUP 80. This means that the carry-out direction in which the substrates are transported out of the FOUP 80 through the opening 50 or the carry-in direction in which the substrates are transported into the FOUP 80 is perpendicular to the direction in which the transport arm 35, after transferring the FOUP 80 to the holding table 41, is disengaged from and moved away from the opener 40. Therefore, the fourth preferred embodiment reduces the depth of the loader 10 to suppress the increase in footprint, as in the first preferred embodiment.

The operation of the loader 10 of the fourth preferred embodiment is similar to that of the first preferred embodiment except that the transport arm 35 does not pass though the holding table 41 in the vertical direction.

The loader 10 according to the fourth preferred embodiment has been described above. The unloader 90 (See FIG. 1) is similar in construction and function to the loader 10. Also, the unloader 90 may include the holding table 41 provided with the recess 44 similar to that of the loader 10 to allow the direct transfer of the FOUP 80 between the transport arm 35 and the holding table 41. This also reduces the time required for the transfer operation of the FOUP 80 to provide a high throughput. The unloader 90 is also similar to the loader 10 in reducing the costs thereof and in eliminating the need to provide a special space for the transport arm 35 to pass through.

<5. Modifications>

The preferred embodiments according to the present invention have been described hereinabove. The present invention, however, is not limited to the above-mentioned preferred embodiments. For instance, although the function of the substrate transfer apparatus according to the present invention is separated into the loader 10 and the unloader 90 in the first to fourth preferred embodiments, the single substrate transfer apparatus may have the functions of the loader 10 and the unloader 90 integrated together. In other words, the single substrate transfer apparatus may both transport unprocessed substrates out of the FOUP 80 and transport processed substrates into the FOUP 80.

The substrate processing apparatus 1 is a so-called batch type apparatus for processing a set of substrates at a time in the first to fourth preferred embodiments, but is not limited thereto. The substrate transfer apparatus according to the present invention may be incorporated in a substrate processing apparatus of a single-substrate type for processing substrates on a one-by-one basis.

The transport arm 35 (202) may be of a rectangular shape with one open side (similar to a U shape), and the holding table 41 may have the shape of a rectangular plate. In this modification, the transport arm 35 vertically passes outside the opposite side surfaces of the holding table 41. This modification also allows the direct transfer of the FOUP 80 between the transport arm 35 and the holding table 41, to reduce the time required for the transfer operation of the FOUP 80, thereby providing a high throughput. Thus, it is essential only that the holding table 41 is formed with a passage portion for a transport element, which permits the transport arm 35 to pass in the vertical direction.

In this case, the holding table 41 is reduced in thickness to provide an open space thereunder, thereby permitting the transport arm 35 to pass under the holding table 41 to move toward one side of the holding table 41. In such an arrangement, the carry-out direction in which the substrates are transported out of the FOUP 80 through the opening 50 or the carry-in direction in which the substrates are transported into the FOUP 80 is perpendicular to the direction in which the transport arm 35, after transferring the FOUP 80 to the holding table 41, is disengaged from and moved away from the opener 40. This reduces the depth of the loader 10 to suppress the increase in footprint.

The constructions of the second and third preferred embodiments may be combined together. Specifically, the lifter 70 (of FIG. 7) is added to the construction shown in FIG. 8. The operation of the loader 10 in this combination is such that the operation of the lifter 70 of the second preferred embodiment is added to the third preferred embodiment.

The constructions of the second and fourth preferred embodiments may be combined together. Specifically, the lifter 70 (of FIG. 7) is added to the construction shown in FIG. 9. The operation of the loader 10 in this combination is such that the operation of the lifter 70 of the second preferred embodiment is added to the fourth preferred embodiment.

Further, the constructions of the third and fourth preferred embodiments may be combined together. Specifically, the opener 40 of FIG. 9 is applied to the loader 10 of FIG. 8. The operation of the loader 10 in this combination is similar to that of the third preferred embodiment except that the transport arm 202 of the AGV 200 does not pass through the holding table 41 in the vertical direction.

While the invention has been described in detail, the foregoing description is in all aspects illustrative and not restrictive. It is understood that numerous other modifications and variations can be devised without departing from the scope of the invention.

What is claimed is:

1. A substrate transfer apparatus for receiving a container for storing at least one substrate therein, and for performing one of a first transport process and a second transport process, said first transport process transporting said at least one substrate out of said container, said second transport process transporting said at least one substrate into said container, said substrate transfer apparatus comprising:
   a receiving section for receiving said container;
   a holding table for placing and holding said container thereon during one of said first transport process and said second transport process; and
   a transport element for transporting said container between said receiving section and said holding table in a horizontal transport direction substantially perpendicular to the direction of said first transport process and said second transport process,
   said transport element having a transport arm movable up and down substantially in a vertical direction while supporting said container from beneath,
   said receiving section being disposed on one side relative to the vertical direction of said transport arm and said holding table being disposed on an opposite side relative to the vertical direction of said transport arm when said transport element is centered along said horizontal transport direction,
   said transport arm being further moveable in a direction substantially perpendicular to the vertical direction while transporting said container between said receiving section and said holding table,
   said holding table being formed with a notch permitting said transport arm to pass therethrough substantially vertically and substantially horizontally towards said receiving section, said notch being open on a side facing said receiving section.

2. The substrate transfer apparatus according to claim 1, further comprising
   a lifting element provided over said holding table and movable up and down substantially vertically while holding a graspable portion formed on a top part of said container,
   wherein, with a first container held by said lifting element, one of the transport of at least one substrate out of a second container placed on said holding table and the transport of at least one substrate into said second container is effected.

3. A substrate processing apparatus for performing one of a first transport process and a second transport process, said first transport process transporting at least one substrate out of a container for storing said at least one substrate therein, said second transport process transporting said at least one substrate into said container, said substrate processing apparatus comprising:
   a receiving section for receiving said container;
   a holding section for placing and holding said container thereon during one of said first transport process and said second transport process; and
   a transport element movable up and down substantially in a vertical direction while supporting said container from beneath and for transporting said container between said receiving section and said holding section in a transport direction substantially perpendicular to the direction of said first transport process and said second transport process,
   said receiving section being disposed on one side relative to the vertical direction of said transport element and said holding table being disposed on an opposite side relative to the vertical direction of said transport element and said transport element being further moveable in a direction substantially perpendicular to the vertical direction while transporting said container between said receiving section and said holding table, said holding section being formed with a notch for said transport element, said notch permitting said transport element to pass through substantially vertically, said notch being open on a side facing said receiving section in said transport direction.

4. The substrate processing apparatus according to claim 3, further comprising a lifting element provided over said holding section and movable up and down substantially vertically while holding a graspable portion formed on a top part of said container, wherein, with a first container held by said lifting element, one of the transport of at least one substrate out of a second container placed on said holding section and the transport of at least one substrate into said second container is effected by said transport element.

5. The substrate processing apparatus according to claim 4, wherein a position in which said transport element supports said container is inward, at a bottom surface of said container, from a position in which said holding section places and holds said container thereon.

6. A substrate processing apparatus for performing one of a first transport process and a second transport process, said first transport process transporting at least one substrate out of a container for storing said at least one substrate therein, said second transport process transporting said at least one substrate into said container, said substrate processing apparatus comprising:

a receiving section for receiving said container;

a holding section for placing and holding said container thereon during one of said first transport process and said second transport process; and a transport element movable up and down substantially vertically while supporting said container from beneath and for transporting said container between said receiving section and said holding section in a transport direction substantially perpendicular to the direction of said first transport process and said second transport process, said receiving section being disposed on one side relative to the vertical direction of said transport element and said holding table being disposed on an opposite side relative to the vertical direction of said transport element and said transport element being further moveable in a direction substantially perpendicular to the vertical direction while transporting said container between said receiving section and said holding table, said holding section being formed with a recess for said transport element, said recess permitting said transport element to enter and to move downwardly to below a top surface of said holding section, said recess being open on a side facing said receiving section in said transport direction.

7. The substrate processing apparatus according to claim 6, further comprising a lifting element provided over said holding section and movable up and down substantially vertically while holding a graspable portion formed on a top part of said container, wherein, with a first container held by said lifting element, one of the transport of at least one substrate out of a second container placed on said holding section and the transport of at least one substrate into said second container is effected by said transport element.

8. The substrate processing apparatus according to claim 7, wherein a position in which said transport element supports said container is inward, at a bottom surface of said container, from a position in which said holding section places and holds said container thereon.

\* \* \* \* \*